United States Patent
Kang

(10) Patent No.: US 7,995,408 B2
(45) Date of Patent: Aug. 9, 2011

(54) CIRCUIT FOR SUPPLYING A REFERENCE VOLTAGE IN A SEMICONDUCTOR MEMORY DEVICE FOR TESTING AN INTERNAL VOLTAGE GENERATOR THEREIN

(75) Inventor: Khil-Ohk Kang, Ichon (KR)

(73) Assignee: Hynix Semiconductor Inc. (KR)

( * ) Notice: Subject to any disclaimer, the term of this patent is extended or adjusted under 35 U.S.C. 154(b) by 549 days.

(21) Appl. No.: 12/169,591

(22) Filed: Jul. 8, 2008

(65) Prior Publication Data

US 2009/0122634 A1    May 14, 2009

(30) Foreign Application Priority Data

Nov. 12, 2007  (KR) .................. 10-2007-0114974

(51) Int. Cl.
*G11C 29/00* (2006.01)

(52) U.S. Cl. ............. 365/201; 365/189.09; 365/189.05; 365/210.12

(58) Field of Classification Search .................. 365/226, 365/210.12, 210.1, 189.05, 189.09, 201
See application file for complete search history.

(56) References Cited

U.S. PATENT DOCUMENTS

| | | | | |
|---|---|---|---|---|
| 5,838,076 A | * | 11/1998 | Zarrabian et al. | 307/115 |
| 5,973,548 A | * | 10/1999 | Ukita et al. | 327/540 |
| 6,429,729 B2 | | 8/2002 | Kobayashi et al. | |
| 7,057,446 B2 | * | 6/2006 | Choi et al. | 327/541 |
| 2002/0105847 A1 | | 8/2002 | Kono et al. | |

FOREIGN PATENT DOCUMENTS

| | | |
|---|---|---|
| JP | 2001-358299 | 12/2001 |
| KR | 1019980075712 | 11/1998 |
| KR | 1020050064669 | 6/2005 |

* cited by examiner

*Primary Examiner* — Andrew Q Tran
(74) *Attorney, Agent, or Firm* — Baker & McKenzie LLP

(57) ABSTRACT

A reference voltage supplying circuit can include an internal reference voltage generating unit configured to generate an internal reference voltage, a pad configured to receive an external reference voltage, a switching unit selectively configured to supply the internal reference voltage or the external reference voltage to an internal voltage generator in a test mode.

12 Claims, 3 Drawing Sheets

CIRCUIT FOR SUPPLYING A REFERENCE VOLTAGE IN A SEMICONDUCTOR MEMORY DEVICE FOR TESTING AN INTERNAL VOLTAGE GENERATOR THEREIN

CROSS-REFERENCES TO RELATED PATENT APPLICATION

This application claims the benefit under 35 U.S.C 119(a) to Korean Application No. 10-2007-0114974, filed on Nov. 12, 2007, in the Korean Intellectual Property Office, the disclosure of which is incorporated herein by reference in its entirety as if set forth in full.

BACKGROUND

1. Technical Field

The embodiments described herein relate to a reference voltage supply circuit in a semiconductor memory apparatus, and more particularly, to a circuit and a method for supplying a reference voltage to a semiconductor memory apparatus for testing the reference voltage.

2. Related Art

Conventional semiconductor integrated circuits use power sources, such as an external supply voltage VDD and a ground voltage VSS, from the outside of a chip, and internal voltages such as a reference voltage (Vref), a peripheral voltage (Vperi), a core voltage (Vcore), an elevated voltage (VPP) and a substrate bias voltage (VBB). To generate these internal voltages, the semiconductor memory apparatus includes various voltage generators.

The reference voltage (Vref) is often used for generating the core voltage (Vcore) and the elevated voltage (VPP). In a conventional semiconductor memory apparatus, it is often the case that a reference voltage level used for a core voltage generator is different from that used for an elevated voltage generator. Consequently, a reference voltage generator is often configured to generate a core reference voltage for the core voltage generator and an elevate reference voltage for the elevated voltage generator respectively.

Meanwhile, a conventional semiconductor memory apparatus receives a reference voltage for buffering data through a reference voltage pad in order to support a buffering operation of input data in a data input buffer. The semiconductor memory apparatus also receives a reference voltage for buffering command addresses through a reference voltage pad in order to support a buffering operation of commands and addresses in a command/address buffer.

As mentioned above, the data buffer reference voltage and the command/address buffer reference voltage are provided externally through the pads. However, a core reference voltage and an elevate reference voltage are internally generated as described above. Generally, the manufacture of a conventional semiconductor memory apparatus includes a wafer test and a package test. However, because the core reference voltage and the elevate reference voltage are not input through a pad, it is not possible to test the core reference voltage and the elevate reference voltage using conventional methods. Accordingly, it is not possible to test for failures in the core reference voltage and the elevate reference voltage after the completion of the package process, which degrades the efficiency of the package test. Consequently, the yield for conventional semiconductor apparatus is reduced because of the limitation on the package test, which also leads to increases in processing time and cost.

SUMMARY

An apparatus and a method for supplying a reference voltage capable of overcoming a technical limitation on a package test by making it possible to test a reference voltage applied to an internal voltage generator are described herein.

In one aspect, a reference voltage supplying circuit according to the embodiments described herein comprises an internal reference voltage generating unit configured to generate an internal reference voltage, a pad configured to receive an external reference voltage, and a switching unit configured to selectively supply the internal reference voltage or the external reference voltage to an internal voltage generator according to a test mode.

In another aspect, a reference voltage supplying circuit according to the embodiments described herein comprises a pad configured to receive an external reference voltage, a switching unit configured to selectively supply an internal reference voltage or the external reference voltage to an internal voltage generator according to a test mode, and a pad output supplement unit configured to generate an internal buffer reference voltage and to supply the internal buffer reference voltage or the external reference voltage to an input buffer according to the test mode.

In still another aspect, a method for supplying a reference voltage comprises the steps of generating an internal buffer reference voltage and an internal reference voltage, supplying an external reference voltage input from a reference voltage pad to an internal voltage generator after a test signal is enabled and supplying the internal buffer reference voltage to an input buffer, and supplying the internal reference voltage to the internal voltage generator after the test signal is disabled and supplying the external reference voltage to the input buffer.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

According to the embodiments described herein, a reference voltage can be supplied to a semiconductor memory apparatus for testing the reference voltage.

Figure 1:
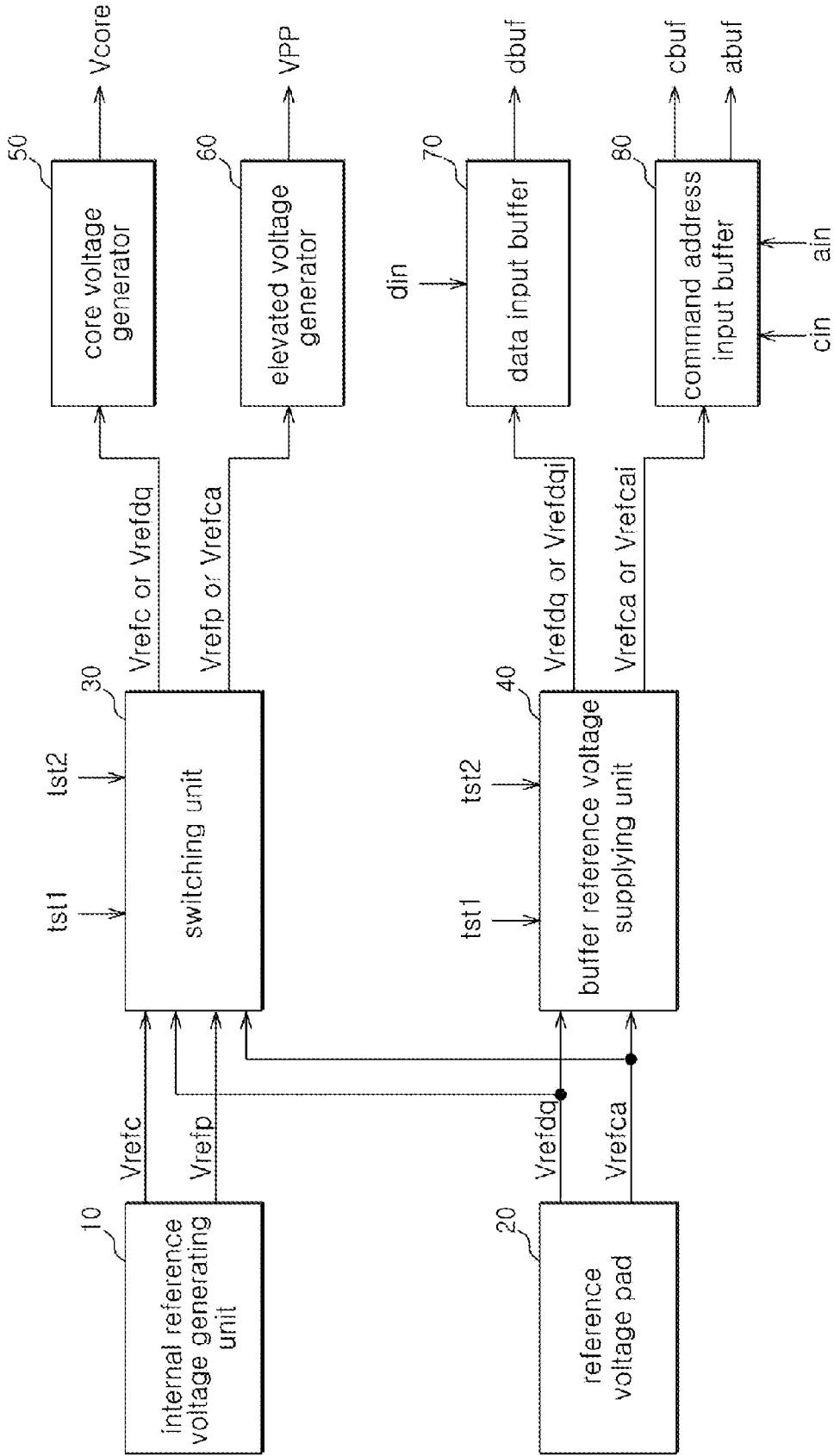
FIG. 1 is a block diagram illustrating a reference voltage supplying circuit according to one embodiment.

FIG. 1 is a diagram illustrating a reference voltage supplying circuit 101 according to one embodiment. Referring to FIG. 1, the reference voltage supplying circuit 101 can include an internal reference voltage generating unit 10, a reference voltage pad 20, a switching unit 30, a buffer reference voltage supplying unit 40, a core voltage generator 50, an elevated voltage generator 60, a data input buffer 70, and a command address input buffer 80.

The internal reference voltage generating unit 10 can generate a core reference voltage Vrefc, which can be used as a reference voltage to generate a core voltage, and an elevate reference voltage Vrefp, which can be used as a reference voltage to generate an elevated voltage.

The reference voltage pad 20 can receive from an external circuit a data buffer reference voltage Vrefdq, which can be used as a reference voltage to buffer the data, and a command address buffer reference voltage Vrefca, which can be used as a reference voltage to buffer commands and addresses. Received data buffer reference voltage Vrefdq and command address buffer reference voltage Vrefca can be transferred to the switching unit 30 via the reference voltage pad 20.

The switching unit 30 can transfer the core reference voltage Vrefc or the data buffer reference voltage Vrefdq in response to a first test signal 'tst1' and transfer the elevate reference voltage Vrefp or the command address buffer reference voltage Vrefca in response to a second test signal 'tst2'.

The buffer reference voltage supplying unit 40 can generate an internal data buffer reference voltage Vrefdqi and an internal command address buffer reference voltage Vrefcai, output the data buffer reference voltage Vrefdq or the internal data buffer reference voltage Vrefdqi in response to the test signal 'tst1', and output the command address buffer reference voltage Vrefca or an internal command address buffer reference voltage Vrefcai in response to the second test signal 'tst2'.

The core voltage generator 50 can generate a core voltage Vcore in response to the core reference voltage Vrefc or the data buffer reference voltage Vrefdq. The elevated voltage generator 60 can generate an elevated voltage VPP in response to the elevate reference voltage Vrefp or the command address buffer reference voltage Vrefca.

The data input buffer 70 can output buffered data 'dbuf' by buffering input data 'din' in response to the data buffer reference voltage Vrefdq or the internal data buffer reference voltage Vrefdqi. The command address input buffer 80 can output a buffered command 'cbuf' and a buffered address 'abuf' by buffering an input command 'cin' and an input address 'ain' in response to the command address buffer reference voltage Vrefca or the internal command address buffer reference voltage Vrefcai.

The core reference voltage Vrefc and the elevate reference voltage Vrefp can be called as an internal reference voltage while the data buffer reference voltage Vrefdq and the command address buffer reference voltage Vrefca can be called as an external reference voltage. In addition, the internal data buffer reference voltage Vrefdqi and the internal command address buffer reference voltage Vrefcai can be called as an internal buffer reference voltage. The first and second test signals 'tst1' and 'tst2' can be external signals in the test mode and can be input through a test signal pad (not shown). After the test, the voltage levels of the first and second test signals 'tst1' and 'tst2' can be fixed internally through a fuse circuit.

In the reference voltage supplying circuit, when the first test signal 'tst1' is disabled, the switching unit 30 can transfer the core reference voltage Vrefc to the core voltage generator 50. This operation can be carried out in a normal operation. Meanwhile, when the first test signal 'tst1' is enabled, the switching unit 30 can transfer the data buffer reference voltage Vrefdq to the core voltage generator 50. As a result, in a test mode, the voltages that are applied from the external circuit to the reference voltage pad 20 can be transferred to the core voltage generator 50. The voltage level that is input into the reference voltage pad 20 can be used as a reference voltage in the core voltage generator 50 in the test mode.

Similarly, when the second test signal 'tst2' is disabled, the switching unit 30 can transfer the elevate reference voltage Vrefp to the elevated voltage generator 60. This operation can be carried out in normal operation. Meanwhile, when the second test signal 'tst2' is enabled, the switching unit 30 can transfer the command address buffer reference voltage Vrefca to the elevated voltage generator 60. As a result, in the test mode, the elevated voltage generator 60 can be tested by using the voltage that is applied from the external circuit to the reference voltage pad 20 as a reference voltage.

On the other hand, when the levels of the data buffer reference voltage Vrefdq and the command address buffer reference voltage Vrefca, which are input through the reference voltage pad 20, are changed, then the data input buffer 70 and the command address input buffer 80 can malfunction. To such a malfunction of the data input buffer 70 and the command address input buffer 80, the buffer reference voltage supplying unit 40 can supply the data buffer reference voltage Vrefdq to the data input buffer 70 when the first test signal 'tst1' is disabled; however, the internal data buffer reference voltage Vrefdqi that is internally generated in the buffer reference voltage supplying unit 40 can be supplied to the data input buffer 70 when the first test signal 'tst1' is enabled.

In addition, the buffer reference voltage supplying unit 40 can supply the command address buffer reference voltage Vrefca to the command address input buffer 80 when the second test signal 'tst2' is disabled; however, the internal command address buffer reference voltage Vrefcai, which is internally generated in the buffer reference voltage supplying unit 40, can be supplied to the command address input buffer 80 when the second test signal 'tst2' is enabled.

In a conventional reference voltage supply circuit, the core reference voltage Vrefc and the elevate reference voltage Vrefp cannot be varied in the package state. To overcome this disadvantage, the reference voltage supply circuit of the semiconductor memory apparatus according to embodiments described herein can have a structure in which the core reference voltage Vrefc and the elevate reference voltage Vrefp can be replaced in a test mode with the data buffer reference voltage Vrefdq and the command address buffer reference voltage Vrefca that are input into the data input buffer 70 and the command address input buffer 80, respectively.

The reference voltage supply circuit of the semiconductor memory apparatus according to embodiments described herein can prevent the disadvantage in the conventional reference voltage supply circuit caused by internally producing the internal data buffer reference voltage Vrefdqi and the internal command address buffer reference voltage Vrefcai and then supplying them to the data input buffer 70 and the command address input buffer 80, respectively. Accordingly, the embodiments described herein overcome the technical limitation in the conventional package test and the efficiency of the test is improved.

In one embodiment, the external reference voltage can be supplied through the reference voltage pad 20 during normal operation; however, the reference voltage pad 20 can be replaced with another pad that can supply the external reference voltage in the test mode. The buffer reference voltage supplying unit 40 can prevent a side effect that is caused when an output signal of the reference voltage pad 20 is used for other purposes at the test mode such that the buffer reference voltage supplying unit 40 can be called to as a "pad output supplement unit."

Figure 2:
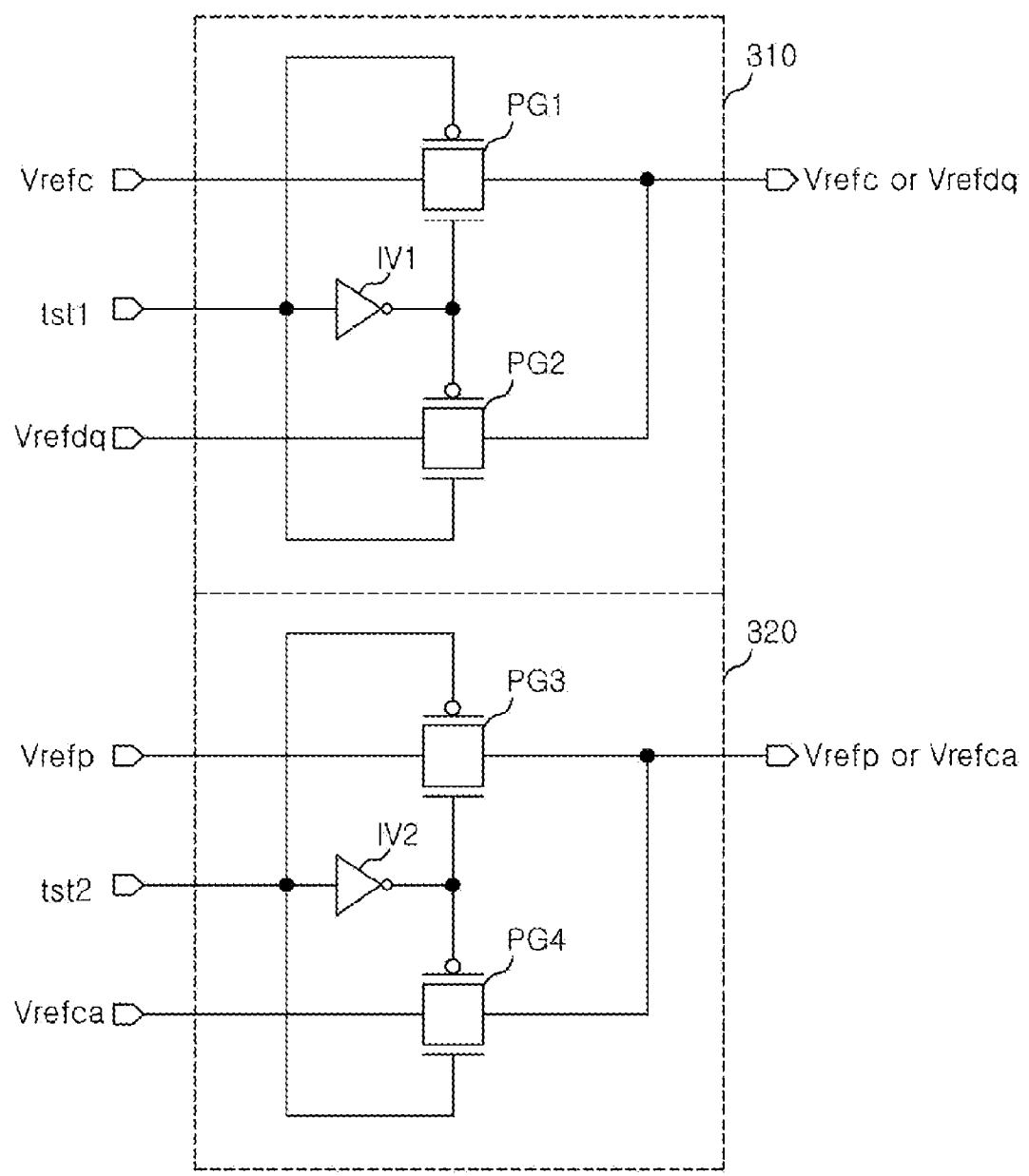
FIG. 2 is a circuit diagram illustrating a switching unit included in the reference voltage supplying circuit of FIG. 1.

FIG. 2 is a circuit diagram illustrating the switching unit 30 of FIG. 1 in more detail. Referring to FIG. 2, the switching unit 30 can include a first switch 310 and a second switch 320.

The first switch 310 can transfer the core reference voltage Vrefc or the data buffer reference voltage Vrefdq in response to the first test signal 'tst1'. The first switch 310 can include a first inverter IV1, a first pass gate PG1 and a second pass gate PG2.

The first inverter IV1 can receive the first test signal 'tst1'. The first pass gate PG1 can transfer the core reference voltage Vrefc in response to the first test signal 'tst1' and an output signal of the first inverter IV1. The second pass gate PG2 can transfer the data buffer reference voltage Vrefdq in response to the first test signal 'tst1' and the output signal of the first inverter IV1.

The second switch 320 can transfer the elevate reference voltage Vrefp or the command address buffer reference voltage Vrefca in response to the second test signal 'tst2'. The second switch 320 can include a second inverter IV2, a third pass gate PG3 and a fourth pass gate PG4.

The second inverter IV2 can receive the second test signal 'tst2'. The third pass gate PG3 can transfer the elevate reference voltage Vrefp in response to the second test signal 'tst2' and an output signal of the second inverter IV2. The fourth pass gate PG4 can transfer the command address buffer reference voltage Vrefca in response to the second test signal 'tst2' and the output signal of the second inverter IV2.

According to the above-mentioned structure, the first switch 310 can output the core reference voltage Vrefc when the first test signal 'tst1' is disabled and output the data buffer reference voltage Vrefdq when the first test signal 'tst1' is enabled. Similarly, the second switch 320 can output the elevate reference voltage Vrefp when the second test signal 'tst2' is disabled and output the command address buffer reference voltage Vrefca when the second test signal 'tst2' is enabled. As mentioned above, an output signal of the first switch 310 can be transferred to the core voltage generator 50 and an output signal of the second switch 320 can be transferred to the elevated voltage generator 60.

Figure 3:
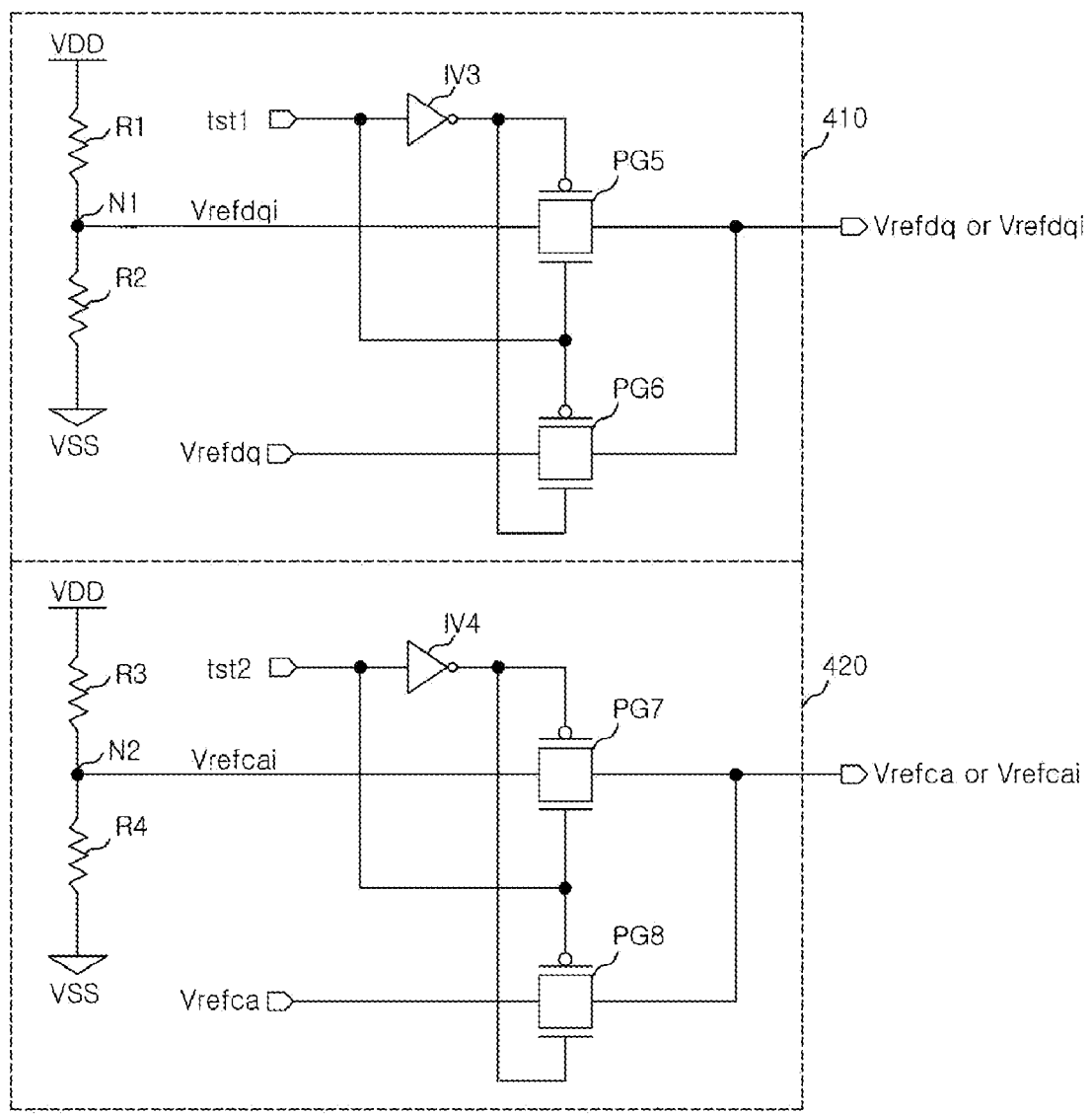
FIG. 3 is a circuit diagram illustrating a buffer reference voltage supplying unit included in the reference voltage supplying circuit of FIG. 1

FIG. 3 is a circuit diagram illustrating the buffer reference voltage supplying unit 40 of FIG. 1 in more detail. Referring to FIG. 3, the buffer reference voltage supplying unit 40 can include a first voltage supplying unit 410 and a second voltage supplying unit 420.

The first voltage supplying unit 410 can generate the internal data buffer reference voltage Vrefdqi and output the data buffer reference voltage Vrefdq or the internal data buffer reference voltage Vrefdqi in response to the first test signal 'tst1'. The first voltage supplying unit 410 can include a first node N1, a first resistor R1, a second resistor R2, a third inverter IV3, a fifth pass gate PG5 and a sixth pass gate PG6.

The internal data buffer reference voltage Vrefdqi can be applied to the first node N1. The first resistor R1 can be provided between a terminal of an external power supply voltage VDD and the first node N1. The second resistor R2 can be provided between the first node N1 and a terminal of a ground voltage VSS. The third inverter IV3 can receive the first test signal 'tst1'. The fifth pass gate PG5 can transfer the internal data buffer reference voltage Vrefdqi in response to the first test signal 'tst1' and an output signal of the third inverter IV3. The sixth pass gate PG6 can transfer the data buffer reference voltage Vrefdq in response to the first test signal 'tst1' and the output signal of the third inverter IV3.

The second voltage supplying unit 420 can generate the internal command address buffer reference voltage Vrefcai and output the command address buffer reference voltage Vrefca or the internal command address buffer reference voltage Vrefcai in response to the second test signal 'tst2'. The second voltage supplying unit 420 can include a second node N2, a third resistor R3, a fourth resistor R4, a fourth inverter IV4, a seventh pass gate PG7 and an eighth pass gate PG8.

The internal command address buffer reference voltage Vrefcai can be applied to the second node N2. The third resistor R3 can be provided between a terminal of the external power supply voltage VDD and the second node N2. The fourth resistor R4 can be provided between the second node N2 and a terminal of the ground voltage VSS. The fourth inverter IV4 can receive the second test signal 'tst2'. The seventh pass gate PG7 can transfer the internal command address buffer reference voltage Vrefcai in response to the second test signal 'tst2' and an output signal of the fourth inverter IV4. The eighth pass gate PG8 can transfer the command address buffer reference voltage Vrefca in response to the second test signal 'tst2' and the output signal of the fourth inverter IV4.

As mentioned above, the first voltage supplying unit 410 can generate the internal data buffer reference voltage Vrefdqi. At this time, it is preferable that the internal data buffer reference voltage Vrefdqi has the same voltage level as the data buffer reference voltage Vrefdq during normal operation. The voltage level of the internal data buffer reference voltage Vrefdqi can be adjusted according to the resistance ratio of the first resistor R1 to the second resistor R2. When the first test signal 'tst1' is disabled, the first voltage supplying unit 410 can output the data buffer reference voltage Vrefdq to the data input buffer 70.

Conversely, when the first test signal 'tst1' is enabled, the first voltage supplying unit 410 can output the internal data buffer reference voltage Vrefdqi to the data input buffer 70. As a result, the data buffer reference voltage Vrefdq, not the core reference voltage Vrefc, is used in the test mode.

Similarly, the second voltage supplying unit 420 can generate the internal command address buffer reference voltage Vrefcai. At this time, it is preferable that the internal command address buffer reference voltage Vrefcai has the same voltage level as the command address buffer reference voltage Vrefca during normal operation. The voltage level of the internal command address buffer reference voltage Vrefcai can be adjusted according to the resistance ratio of the third resistor R3 to the fourth resistor R4. When the second test signal 'tst2' is disabled, the second voltage supplying unit 420 can output the command address buffer reference voltage Vrefca to the command address input buffer 80.

Conversely, when the second test signal 'tst2' is enabled, the second voltage supplying unit 420 can output the internal command address buffer reference voltage Vrefcai to the command address input buffer 80. As a result, the command address buffer reference voltage Vrefca, not the elevate reference voltage Vrefp, is used in the test mode.

As should be apparent from the above description, the reference voltage supplying circuit according to the embodiments described herein makes it possible to adjust the internal reference voltage in the package state because the reference voltage input through the reference voltage pad can be supplied to the internal voltage generator in the test mode. The reference voltage supplying circuit can prevent the reference voltage supplied to the input buffer from being varied, by having a structure in which the reference voltage for the buffer is internally generated and provided. Therefore, the reference voltage supplying circuit according to the embodiments described herein can overcome the technical limitation of a conventional package test. Accordingly, device yields can be increased with the improved efficiency of the package test and the reduction in the processing time and cost.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A semiconductor memory apparatus having a reference voltage supplying circuit, the reference voltage supplying circuit comprising:
   a pad configured to receive an external reference voltage;
   a switching unit configured to selectively supply an internal reference voltage or the external reference voltage to an internal voltage generator according to a test mode; and
   a pad output supplement unit configured to generate an internal buffer reference voltage and to supply the internal buffer reference voltage or the external reference voltage to an input buffer according to the test mode.

2. The semiconductor memory apparatus of claim 1, wherein the switching unit is configured to supply the external reference voltage to the internal voltage generator at the test mode and to supply the internal reference voltage to the internal voltage generator when the test mode is terminated.

3. The semiconductor memory apparatus of claim 2, wherein the internal reference voltage is a core reference voltage and the external reference voltage is a data buffer reference voltage.

4. The semiconductor memory apparatus of claim 2, wherein the internal reference voltage is an elevate reference voltage and the external reference voltage is a command address buffer reference voltage.

5. The semiconductor memory apparatus of claim 2, wherein the internal reference voltage includes a core reference voltage and an elevate reference voltage, the internal voltage generator includes a core voltage generator and an elevated voltage generator, the external reference voltage includes a data buffer reference voltage and a command address buffer reference voltage, and the test mode is performed in response to first and second test signals.

6. The semiconductor memory apparatus of claim 5, wherein the switching unit includes:
   a first switch configured to supply the core reference voltage or the data buffer reference voltage to the core voltage generator in response to the first test signal; and
   a second switch configured to supply the elevate reference voltage or the command address buffer reference voltage to the elevated voltage generator in response to the second test signal.

7. The semiconductor memory apparatus of claim 1, wherein the pad output supplement unit is configured to supply the internal buffer reference voltage to the input buffer at the test mode and to supply the external reference voltage to the input buffer when the test mode is terminated.

8. The semiconductor memory apparatus of claim 7, wherein the external reference voltage is a data buffer reference voltage, the internal buffer reference voltage is a internal data buffer reference voltage, and the data buffer reference voltage has a same voltage level as the internal data buffer reference voltage at a normal operation.

9. The semiconductor memory apparatus of claim 7, wherein the external reference voltage is a command address buffer reference voltage, the internal buffer reference voltage is an internal command address buffer reference voltage, and the command address buffer reference voltage has a same voltage level as the internal command address buffer reference voltage at a normal operation.

10. The semiconductor memory apparatus of claim 7, wherein the external reference voltage includes a data buffer reference voltage and a command address buffer reference voltage, the input buffer includes a data input buffer and a command address input buffer, the internal buffer reference voltage includes an internal data buffer reference voltage and an internal command address buffer reference voltage, and the test mode is performed in response to first and second test signals.

11. The semiconductor memory apparatus of claim 10, wherein the pad output supplement unit comprises:
   a first voltage supplying unit configured to generate the internal data buffer reference voltage and selectively supplying the data buffer reference voltage or the internal data buffer reference voltage to the data input buffer in response to the first test signal; and
   a second voltage supplying unit configured to generate the internal command address buffer reference voltage and to selectively supply the command address buffer reference voltage or the internal command address buffer reference voltage to the command address input buffer in response to the second test signal.

12. The semiconductor memory apparatus of claim 7, further comprising an internal reference voltage generating unit configured to generate the internal reference voltage.

* * * * *